United States Patent
Liu et al.

(10) Patent No.: US 11,387,124 B2
(45) Date of Patent: *Jul. 12, 2022

(54) WAFER CONTAINER AND METHOD FOR HOLDING WAFER

(71) Applicant: Taiwan Semiconductor Manufacturing Company, Ltd., Hsinchu (TW)

(72) Inventors: Wei-Kang Liu, Taichung (TW); Chi-Chung Jen, Kaohsiung (TW); Jui-Ming Huang, Kaohsiung (TW); Wan-Ting Liao, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/033,938

(22) Filed: Sep. 28, 2020

(65) Prior Publication Data

US 2021/0013057 A1 Jan. 14, 2021

Related U.S. Application Data

(63) Continuation of application No. 15/884,343, filed on Jan. 30, 2018, now Pat. No. 10,811,291.

(60) Provisional application No. 62/582,963, filed on Nov. 8, 2017.

(51) Int. Cl.
*H01L 21/683* (2006.01)
*H01L 21/673* (2006.01)

(52) U.S. Cl.
CPC .... *H01L 21/6735* (2013.01); *H01L 21/67326* (2013.01); *H01L 21/67383* (2013.01); *H01L 21/683* (2013.01); *H01L 2221/683* (2013.01)

(58) Field of Classification Search
CPC .......... H01L 21/6735; H01L 21/67326; H01L 21/67383; H01L 21/683; H01L 2221/683
USPC ........................................ 206/710
See application file for complete search history.

(56) References Cited

U.S. PATENT DOCUMENTS

| | | | | |
|---|---|---|---|---|
| 5,890,598 | A * | 4/1999 | Hayashida | H01L 21/6734 206/710 |
| 6,186,344 | B1 * | 2/2001 | Park | H01L 21/6734 211/41.1 |
| 6,357,604 | B1 * | 3/2002 | Wingo | H01L 21/67309 118/500 |
| 10,811,291 | B2 * | 10/2020 | Liu | H01L 21/6735 |
| 2003/0070960 | A1 * | 4/2003 | Chen | H01L 21/67265 206/711 |
| 2014/0231370 | A1 * | 8/2014 | Han | H01L 21/67383 211/41.1 |

* cited by examiner

*Primary Examiner* — Steven A. Reynolds
(74) *Attorney, Agent, or Firm* — JCIPRNET

(57) ABSTRACT

Provided is a wafer container including a frame having a first sidewall and a second sidewall extending along a YZ plane; a plurality of first support structures disposed on the first sidewall and arranged along a Z direction; and a plurality of second support structures disposed on the second sidewall and arranged along the Z direction. One of the plurality of first support structures is horizontally aligned with a corresponding second support structure to constitute a wafer holder. The wafer holder includes a plurality of island structures to hold a wafer in a XY plane, and the plurality of island structures are separated to each other along a X direction. A method for holding at least one wafer is also provided.

20 Claims, 8 Drawing Sheets

WAFER CONTAINER AND METHOD FOR HOLDING WAFER

CROSS-REFERENCE TO RELATED APPLICATION

This application is a continuation application of and claims the priority benefit of a prior application Ser. No. 15/884,343, filed on Jan. 30, 2018, now allowed. The prior application claims the priority benefit of U.S. provisional application Ser. No. 62/582,963, filed on Nov. 8, 2017. The entirety of each of the above-mentioned patent applications is hereby incorporated by reference herein and made a part of this specification.

BACKGROUND

Robotics are commonly used in the semiconductor manufacturing industry to transfer semiconductor wafers, also known as substrates, throughout the fabrication area. Conventional wafer cassettes are typically used to retain a group of wafers that are commonly referred to collectively as a lot. Many times throughout the manufacturing process, the individual semiconductor wafers must be loaded into or out of the wafer cassettes. Semiconductor integrated circuit fabrication facilities ("fabs") are automated. Movement of semiconductor wafers between various process tools is accomplished by an automated material handling system (AMHS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
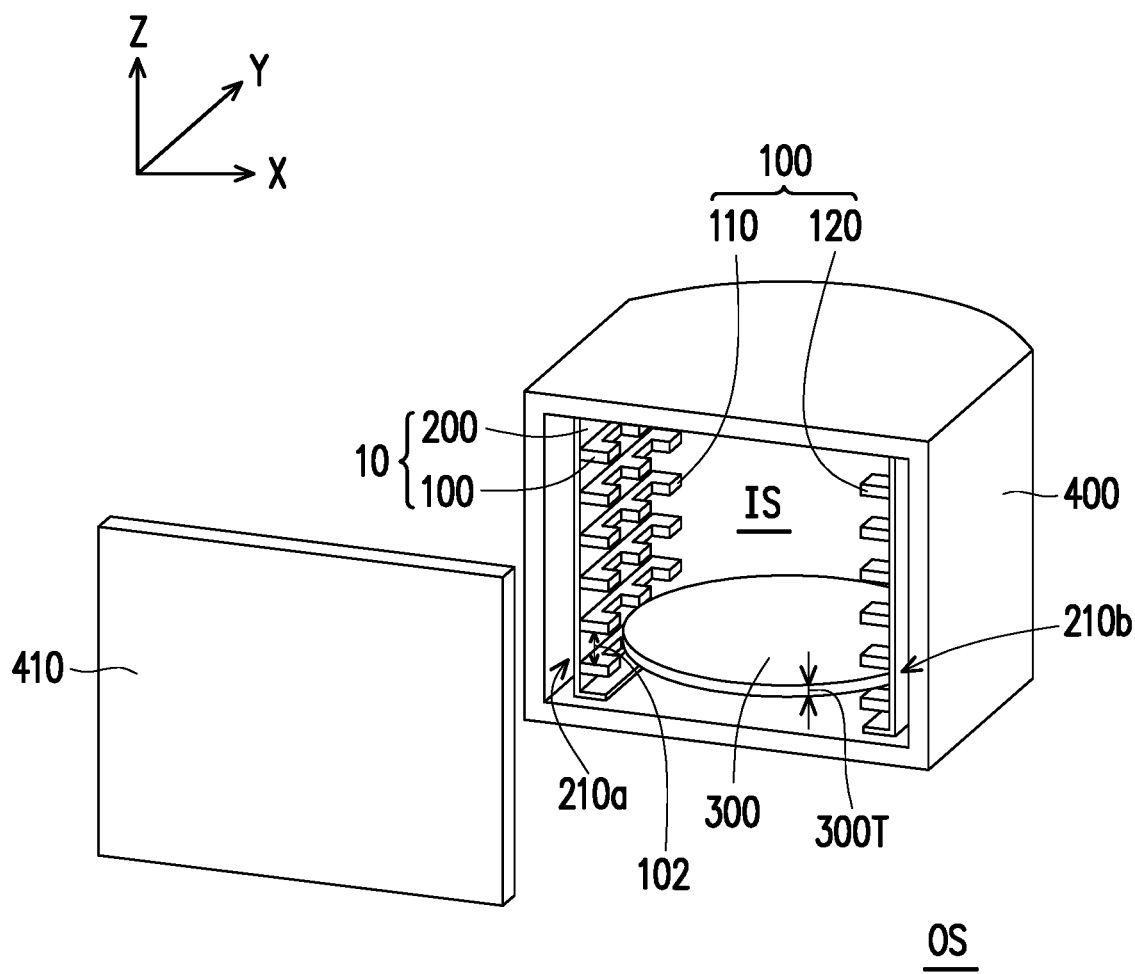
FIG. 1 is a schematic view of a wafer container in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
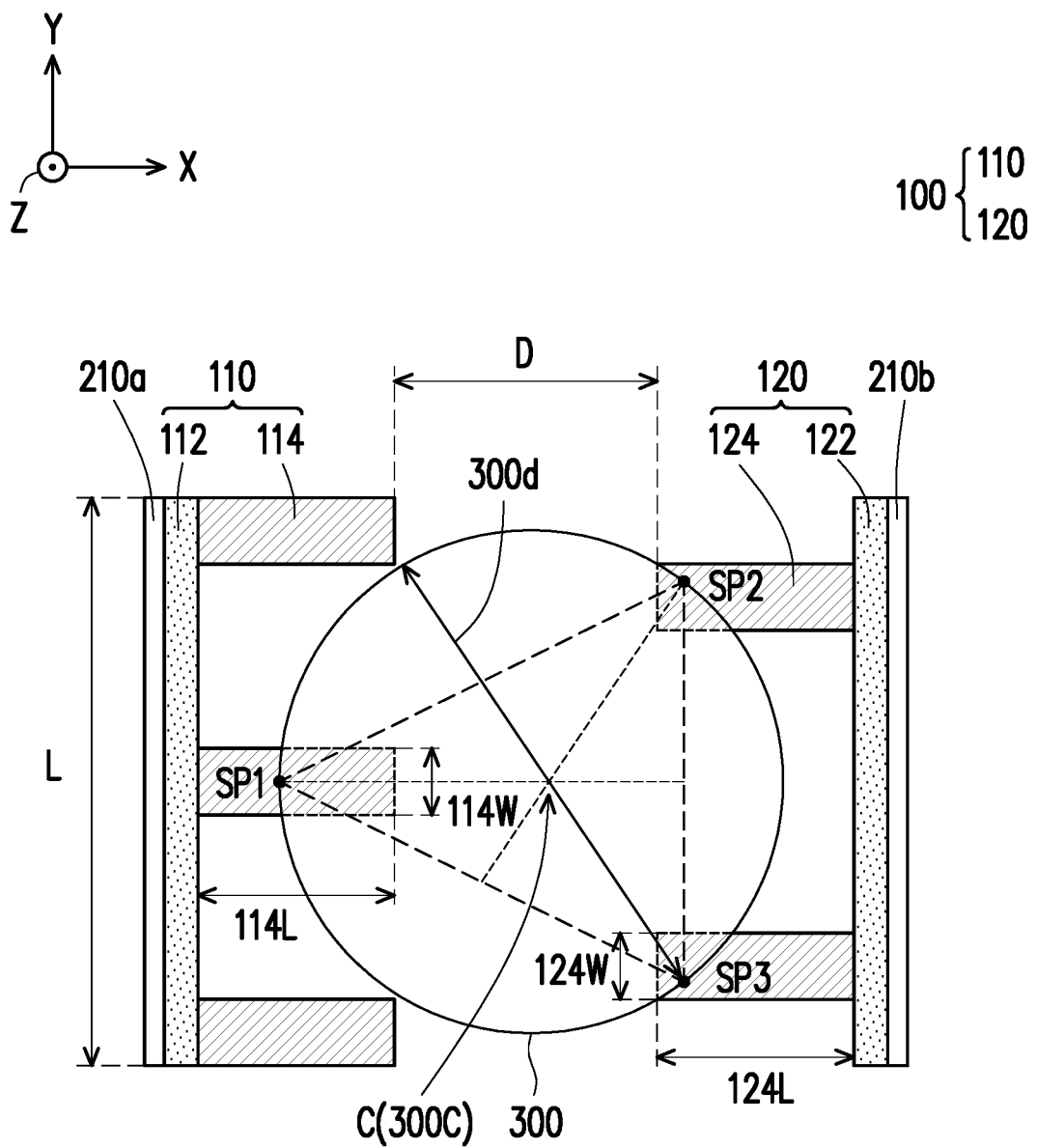
FIG. 2 is a top view of a pair of stents of the wafer container of FIG. 1.

FIG. 1 is a schematic view of a wafer container in accordance with some embodiments of the present disclosure. FIG. 2 is a top view of a pair of stents of the wafer container of FIG. 1.

Referring to FIG. 1, a wafer container 10 is fitted into a box 400 according to some embodiments of the present disclosure. The box 400 may be utilized for shipping at least one wafer 300. There may be some features (not shown) in the box 400 for fixing the wafer container 10 or moving the wafer container 10, such as slides. In some embodiments of the present disclosure, the box 400 may not be fully sealed since the door 410 of the box 400 leaves an air gap at the edge of the door 410 when the door 410 is closed. As a result, in some embodiments, the inner space IS may be in fluid communication with the outer space OS.

As shown in FIG. 1, the wafer container 10 includes at least a pair of the stents 100 and a frame 200. In some embodiments of the present disclosure, the pair of the stents 100 and the frame 200 are made of, for example, plastic, barrier material, Carbon-filled PC or a combination thereof. In one or more embodiments, the pair of the stents 100 and the frame 200 may be made of the same or different materials. In some embodiments of the present disclosure, the pair of the stents 100 is capable of holding the wafer 300. The frame 200 carries the pair of the stents 100 and allows access to the pair of the stents 100. Although the wafer container 10 illustrated in FIG. 1 is a front opening unified pod (FOUP), it should not limit various embodiments of the present disclosure. In some alternative embodiments of the present disclosure, the wafer container 10 may include a front opening shipping box (FOSB), a wafer standardized mechanical interface (SMIF) pod, a sorter, or a combination thereof. In some other embodiments of the present disclosure, the wafer container 10 may be a wafer cassette.

As shown in FIG. 1, in some embodiments of the present disclosure, the frame 200 has at least a pair of sidewalls 210a and 210b opposite to each other, and the pair of the stents 100 is respectively disposed on the sidewalls 210a and 210b of the frame 200. That is, the pair of the stents 100 is respectively stationary with respect to the sidewalls 210a and 210b of the frame 200. The pair of the stents 100 may be substantially horizontally aligned, so that the wafer 300 is substantially level. In some embodiments of the present disclosure, there may be plural pairs of the stents 100 respectively present on the sidewalls 210a and 210b of the frame 200. The pairs of the stents 100 are respectively stationary with respect to the sidewalls 210a and 210b of the frame 200 and vertically spaced apart to define at least one slot for the wafer 300. That is, in some embodiments of the present disclosure, a gap 102 between two adjacent stents 100 in a Z direction is greater than the thickness 300T of the wafer 300, so that the wafer 300 may be easily accommodated into the wafer container 10. Through the configuration of the pairs of the stents 100, the stents 100 support the edges of the wafers 300, and the wafers 300 may be temporarily stored in the wafer container 10. In some embodiments of the present disclosure, the pairs of the stents 100 are arranged alternately in the Z direction.

As shown in FIG. 1 and FIG. 2, in some embodiments of the present disclosure, the pair of the stents 100 comprises a first stent 110 and a second stent 120 opposite to each other. As shown in FIG. 2, the first stent 110 is separated from the second stent 120 by a distance D in an X direction (e.g., a first direction). The distance D may be less than a diameter 300d of the wafer 300. In some embodiments of the present disclosure, the distance D may be in a range of 180 mm to 300 mm. The first stent 110 and the second stent 120 may be substantially horizontally aligned, so that the wafer 300 is substantially level.

In detail, the first stent 110 includes a first connection portion 112 and a plurality of first comb portions 114. The plurality of first comb portions 114 are connected to the first connection portion 112 to form a first comb structure. The first connection portion 112 extends along a Y direction (e.g., a second direction) and is fixed on the sidewall 210a. In some embodiments, a length L of the first connection portion 112 in the Y direction is greater than the diameter 300d of the wafer 300. In some embodiments of the present disclosure, the length L of the first connection portion 112 in the Y direction may be in a range of 300 mm to 355 mm. The plurality of first comb portions 114 are arranged along the Y direction. In some embodiments of the present disclosure, one of the plurality of first comb portions 114 may be a continuous structure extending in an X direction perpendicular to the sidewall 210a. In some alternative embodiments of the present disclosure, all of the plurality of first comb portions 114 may be continuous structures extending in the X direction perpendicular to the sidewall 210a. As shown in FIG. 2, one of the plurality of first comb portions 114 has a length 114L and a width 114W. In some embodiments of the present disclosure, the length 114L of one of the plurality of first comb portions 114 may be in a range of 63 mm to 123 mm; the width 114W of one of the plurality of first comb portions 114 may be in a range of 1 mm to 150 mm. In some embodiments of the present disclosure, the X direction, the Y direction, and the Z direction are substantially perpendicular to each other. In some embodiments of the present disclosure, the length 114L of one of the first comb portions 114 and the length 114L of another of the first comb portions 114 are the same as or different from each other; the width 114W of one of the first comb portions 114 and the width 114W of another of the first comb portions 114 are the same as or different from each other.

In some embodiments of the present disclosure, the second stent 120 includes a second connection portion 122 and a plurality of second comb portions 124. The plurality of second comb portions 124 are connected to the second connection portion 122 to form a second comb structure. The second connection portion 122 extends along the Y direction and is fixed on the sidewall 210b. The plurality of second comb portions 124 are arranged along the Y direction. In some embodiments of the present disclosure, one of the plurality of second comb portions 124 may be the continuous structure extending in the X direction perpendicular to the sidewall 210b. In some alternative embodiments of the present disclosure, all of the plurality of second comb portions 124 may be continuous structures extending in the X direction perpendicular to the sidewall 210b. As shown in FIG. 2, one of the plurality of second comb portions 124 has a length 124L and a width 124W. In some embodiments of the present disclosure, the length 124L of one of the second comb portions 124 and the length 124L of another of the second comb portions 124 are the same as or different from each other; the width 124W of one of the second comb portions 124 and the width 124W of another of the second comb portions 124 are the same as or different from each other. In some embodiments of the present disclosure, the length 124L of one of the second comb portions 124 and the length 114L of one of the first comb portions 114 are the same as or different from each other; the width 124W of one of the second comb portions 124 and the width 114W of one of the first comb portions 114 are the same.

Although the sum of the plurality of first comb portions 114 and the plurality of second comb portions 124 illustrated in FIG. 2 is five comb portions, it should not limit various embodiments of the present disclosure. In some alternative embodiments of the present disclosure, the sum of the plurality of first comb portions 114 and the plurality of second comb portions 124 may be at least three comb portions that are able to form a triangle to hold the wafer 300. As shown in FIG. 2, the pair of the stents 100 is configured to provide at least three supporting points SP1, SP2, and SP3 to support the wafer 300. That is to say, the wafer 300 is in contact with the stents 100 (i.e., the first stent 110 and the second stent 120) at the three supporting points SP1, SP2, and SP3. A centroid C of a triangle formed by the three supporting points SP1, SP2, and SP3 overlaps a center 300C of the wafer 300. Therefore, the wafer 300 is able to be balanced by the three supporting points SP1, SP2, and SP3. Although the number of the supporting points SP1, SP2, and SP3 illustrated in FIG. 2 is three, it should not limit various embodiments of the present disclosure. In some alternative embodiments of the present disclosure, the number of the supporting points (where the wafer 300 is in direct contact with the stents 100) is more than three, such as 4 points, 5 points, 6 points or more points.

In some embodiments of the present disclosure, the plurality of first comb portions and the plurality of second comb portions are arranged in a completely interleaving, partially interleaving, completely aligned, or partially aligned configuration. The configurations will be described in detail in the following paragraphs.

It should be noted that, in some embodiments of the present disclosure, a contact area between the wafer 300 and the stents 100 (i.e., the first stent 110 and the second stent 120) may be decreased significantly. Therefore, the particles and/or moisture is hardly adhered to the stents 100. On the other hands, the stents 100 having the plurality of first comb portions 114 and the plurality of second comb portions 124 may be cleaned easily by utilizing gas (e.g., $N_2$) purge. As a result, the defects formed at the wafer edge may decrease significantly. The reliability of the semiconductor device formed over the wafer is therefore reinforced.

Figure 3A:
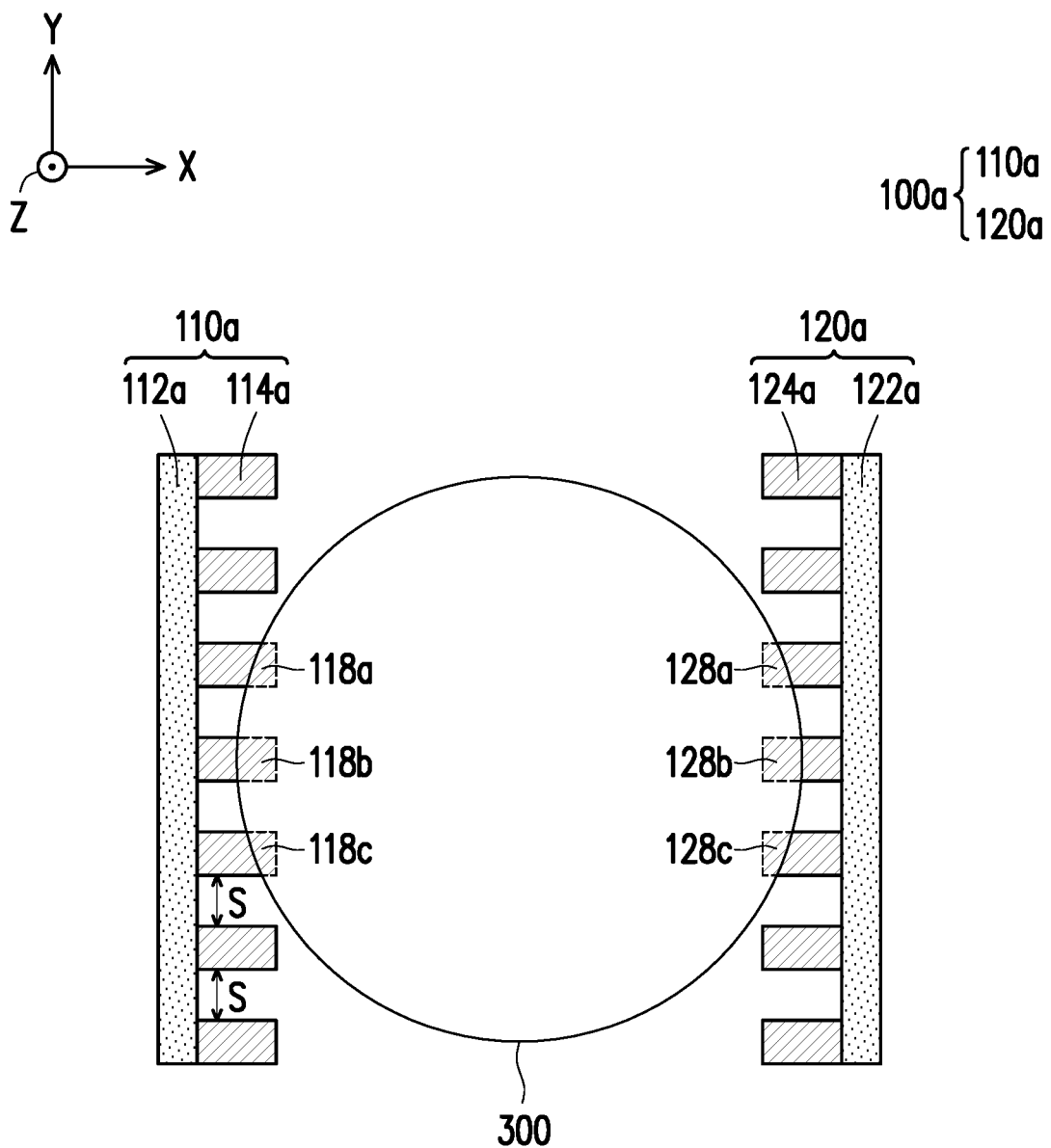
FIGS. 3A to 3C are schematic views of a pair of stents in accordance various embodiments of the present disclosure.
Figure 3B:
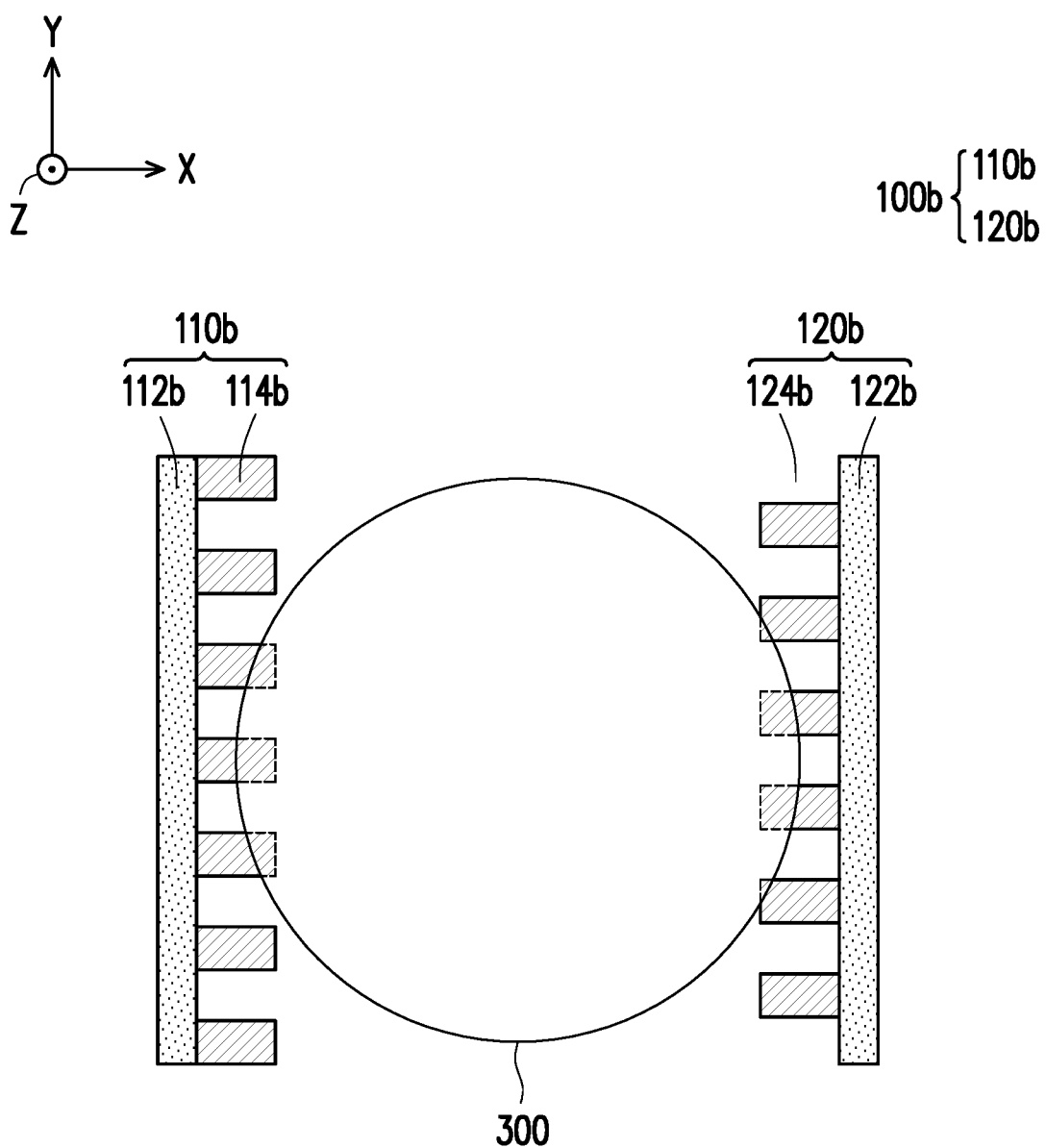
Figure 3C:
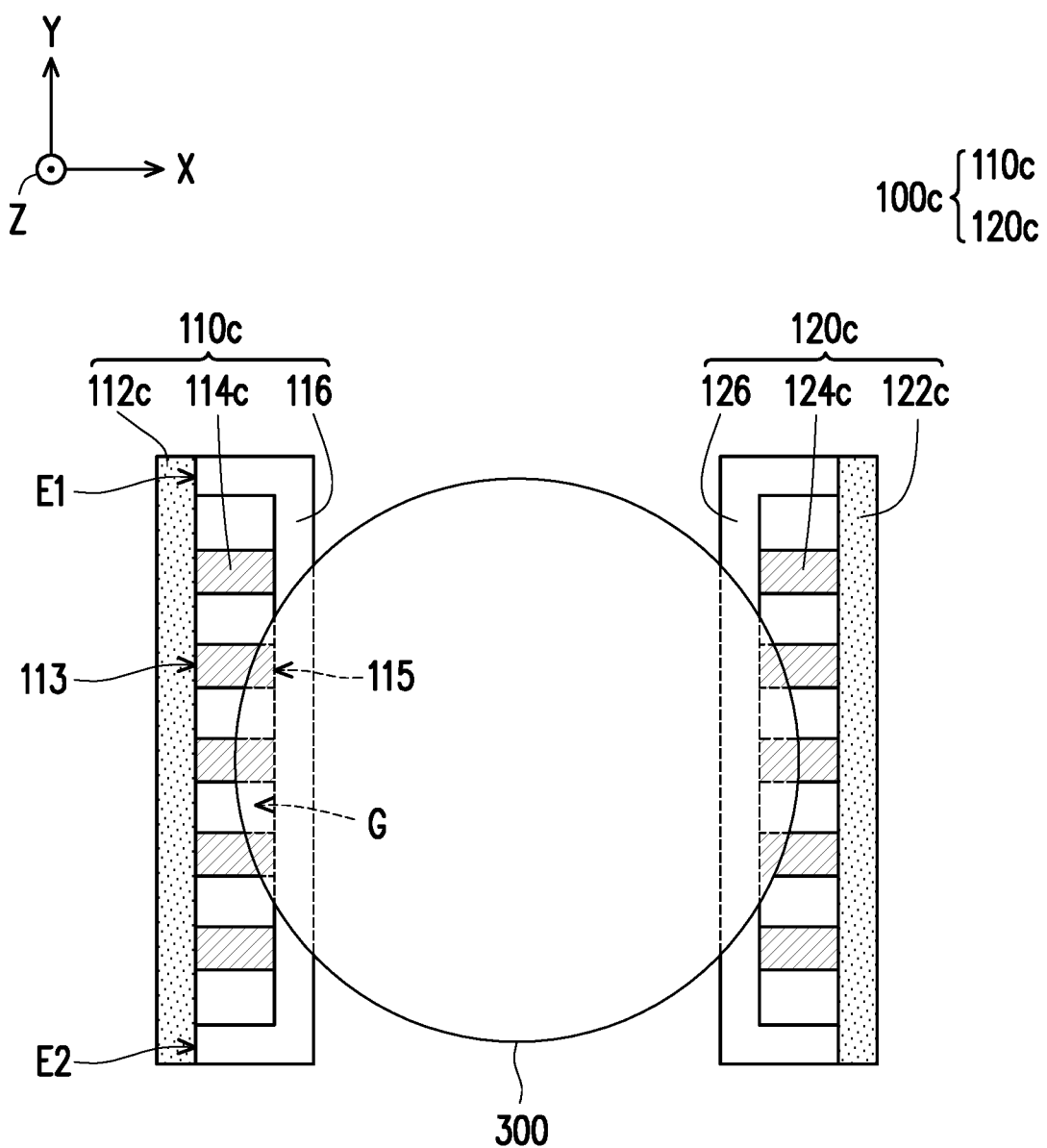

FIGS. 3A to 3C are schematic views of a pair of stents in accordance various embodiments of the present disclosure.

Referring to FIG. 3A, the pair of stents 100a comprise a first stent 110a and a second stent 120a opposite to each other. The first stent 110a includes a first connection portion 112a and a plurality of first comb portions 114a connected to the first connection portion 112a. The second stent 120a includes a second connection portion 122a and a plurality of second comb portions 124a connected to the second connection portion 122a. As shown in FIG. 3A, the plurality of first comb portions 114a are arranged along the Y direction with equal spacing. In some embodiments of the present disclosure, a spacing S between the plurality of first comb portions 114a is in a range of 1 mm to 240 mm. In some alternative embodiments of the present disclosure, the plurality of first comb portions 114a are arranged along the Y direction with non-equal spacing. As shown in FIG. 3A, in some alternative embodiments of the present disclosure, the plurality of second comb portions 124a are arranged along the Y direction with equal spacing. In some alternative embodiments of the present disclosure, the plurality of second comb portions 124a are arranged along the Y direction with non-equal spacing.

In some embodiments of the present disclosure, at least one of the plurality of first comb portions 114a is arranged to correspond to at least one of the plurality of second comb portions 124a. That is to say, a projection of one of the plurality of first comb portions 114a on a YZ plane may overlap with another projection of one of the plurality of second comb portions 124a on the YZ plane. In some alternative embodiments of the present disclosure, a projection of all of the plurality of first comb portions 114a on the YZ plane may overlap with another projection of all of the plurality of second comb portions 124a on the YZ plane. In some embodiments of the present disclosure, the number of the plurality of first comb portions 114a and the number of the plurality of second comb portions 124a may be the same.

It should be noted that, as shown in FIG. 3A, the wafer 300 is in direct and/or physical contact with the plurality of first comb portions 114a to form first contact regions 118a, 118b and 118c. In some embodiments of the present disclosure, the first contact regions 118a, 118b and 118c are non-continuous in the Y direction (e.g., a second direction). That is to say, the first contact regions 118a, 118b and 118c are spaced from each other by a distance S and not connect to each other. Similarly, the wafer 300 is in direct and/or physical contact with the plurality of second comb portions 124a to form the second contact regions 128a, 128b and 128c. In some embodiments of the present disclosure, the second contact regions 128a, 128b and 128c between the wafer 300 and the plurality of second comb portions 124a are non-continuous in the Y direction. In other words, the area of the first contact regions 118a, 118b and 118c and/or the second contact regions 128a, 128b and 128c is less than the strip-shaped and/or continuous area. Accordingly, the contact area between the wafer 300 and the stents 100a is able to be decreased significantly.

Referring to FIG. 3B, the pair of stents 100b comprises a first stent 110b and a second stent 120b opposite to each other. The first stent 110b includes a first connection portion 112b and a plurality of first comb portions 114b connected to the first connection portion 112b. The second stent 120b includes a second connection portion 122b and a plurality of second comb portions 124b connected to the second connection portion 122b. As shown in FIG. 3B, the plurality of first comb portions 114b are arranged interleavingly with the plurality of second comb portions 124b. To be specific, a projection of one of the plurality of first comb portions 114b on the YZ plane may overlap with another projection of one space between the adjacent two second comb portions 124b on the YZ plane. In some alternative embodiments of the present disclosure, a projection of all of the plurality of first comb portions 114b on the YZ plane may overlap with another projection of all spaces between the plurality of second comb portions 124b on the YZ plane. As shown in FIG. 3B, although the plurality of first comb portions 114b and the plurality of second comb portions 124b are arranged in a completely interleaving configuration, it should not limit various embodiments of the present disclosure. In some alternative embodiments of the present disclosure, the plurality of first comb portions 114b and the plurality of second comb portions 124b may be arranged in a partially interleaving configuration or in a partially overlapped configuration.

In some embodiments of the present disclosure, the number of the plurality of first comb portions 114b and the number of the plurality of second comb portions 124b may be different from each other. In some alternative embodiments of the present disclosure, the number of the plurality of first comb portions 114b and the number of the plurality of second comb portions 124b may be the same, while the plurality of first comb portions 114b are configured to be interlaced with the plurality of second comb portions 124b.

Referring to FIG. 3C, the pair of stents 100c comprises a first stent 110c and a second stent 120c opposite to each other. The first stent 110c includes a first connection portion 112c, a plurality of first comb portions 114c, and a first case 116. In detail, first sides 113 of the plurality of first comb portions 114c are connected to the first connection portion 112c, while second sides 115 of the plurality of first comb portions 114c are connected to the first case 116. The first case 116 is extended and connected from a first terminal E1 of the first connection portion 112c to a second terminal E2 of the first connection portion 112c and surrounds the plurality of first comb portions 114c to strengthen the mechanical strength of the first stent 110c. Therefore, the first stent 110c may not be easily damaged or collapsed during the operation for holding the wafer 300 or during the cleaning by utilizing gas (e.g., $N_2$) purge. As shown in FIG. 3C, in some embodiments of the present disclosure, a gap G exists between two adjacent first comb portions 114c, so that the plurality of first comb portions 114c do not contact the wafer 300 at the gaps G.

Similarly, the second stent 120c includes a second connection portion 122c, a plurality of second comb portions 124c, and a second case 126. The plurality of second comb portions 124c are connected to the second connection portion 122c. The second case 126 is connected to opposite sides of the second connection portion 122c and surrounds the plurality of second comb portions 124c to strengthen the mechanical strength of the second stent 120c. Although the plurality of first comb portions 114c illustrated in FIG. 3C are arranged to correspond to the plurality of second comb portions 124c, it should not limit various embodiments of the present disclosure. In some alternative embodiments of the present disclosure, the plurality of first comb portions 114c may be arranged interleavingly with the plurality of second comb portions 124c. In some embodiments of the present disclosure, materials of the first connection portion 112c, the plurality of first comb portions 114c, and the first case 116 may be the same. In some alternative embodiments of the present disclosure, the materials of the first connection portion 112c, the plurality of first comb portions 114c, and the first case 116 may be different from each other.

FIGS. 4A to 4D are schematic views of a portion of the stents in accordance various embodiments of the present disclosure.

Figure 4A:
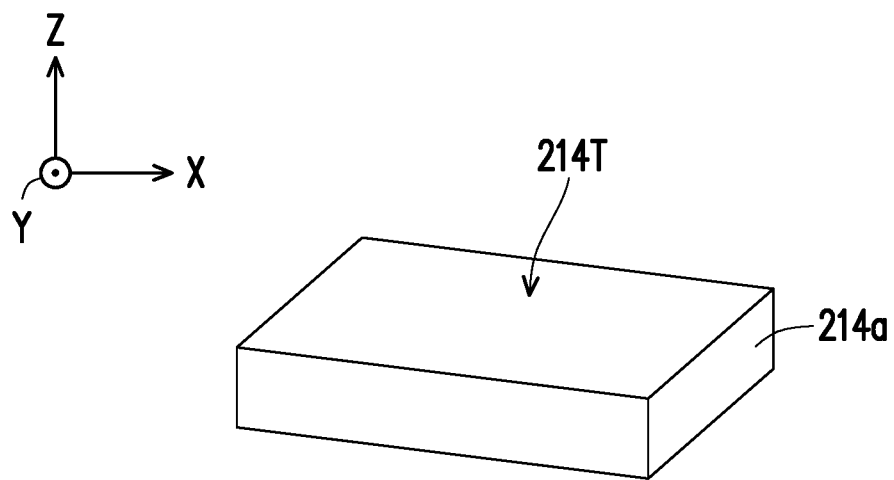
FIGS. 4A to 4D are schematic views of a portion of the stents in accordance various embodiments of the present disclosure.
Figure 4B:
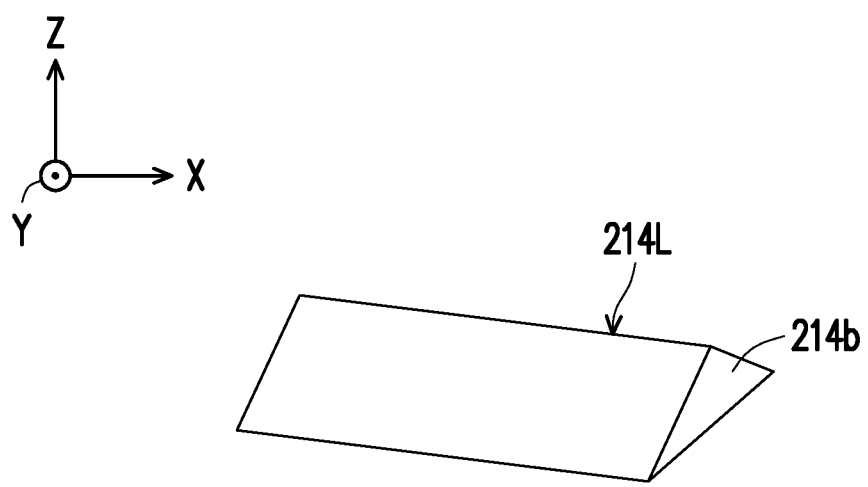
Figure 4C:
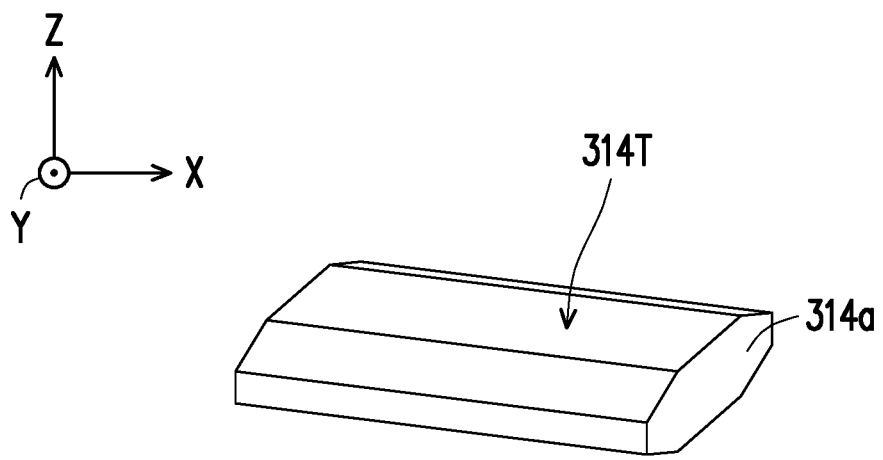
Figure 4D:
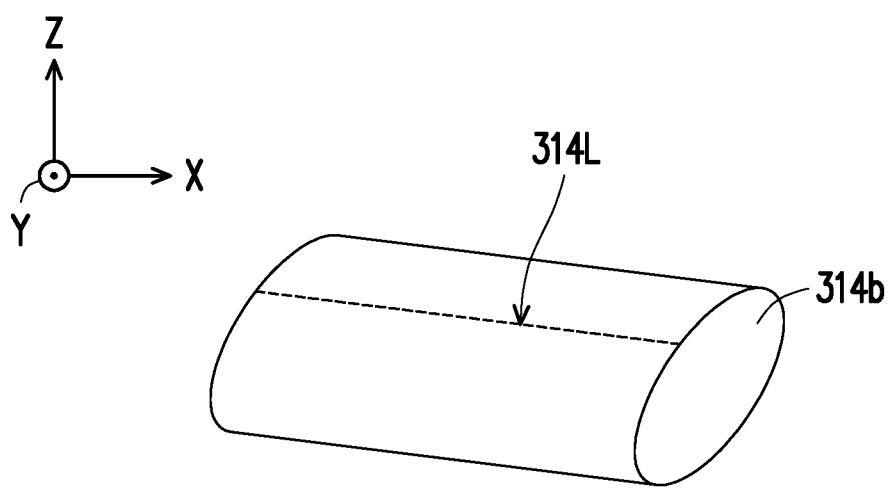

Referring back to FIG. 1, one of the plurality of comb portions may be a continuous structure extending in the X direction perpendicular to the pair of sidewalls 210a and 210b of the frame 200. In some embodiments of the present disclosure, the continuous structure may be a pillar structure, such as a rectangular pillar structure 214a (as shown in FIG. 4A), a triangular pillar structure 214b (as shown in FIG. 4B), a polygonal pillar structure 314a (as shown in FIG. 4C), a circular pillar structure 314b (as shown in FIG. 4D), or a combination thereof. Specifically, as shown in FIG. 4A, the rectangular pillar structure 214a is in contact with the wafer 300 (as shown in FIG. 1) by a plane (or a top surface) 214T. As shown in FIG. 4B, the triangular pillar structure 214b is in contact with the wafer 300 (as shown in FIG. 1) by a line 214L. As shown in FIG. 4C, the polygonal pillar structure 314a is in contact with the wafer 300 (as shown in FIG. 1) by a plane (or a top surface) 314T. As shown in FIG. 4D, the circular pillar structure 314b is in contact with the wafer 300 (as shown in FIG. 1) by a line 314L.

Figure 5A:
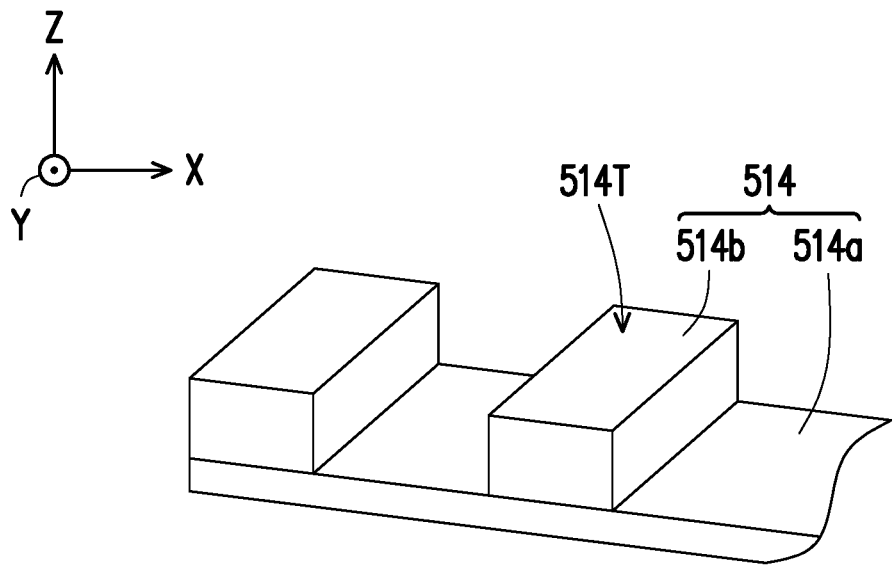
FIGS. 5A to 5B are schematic views of a portion of the stents in accordance some other embodiments of the present disclosure.
Figure 5B:
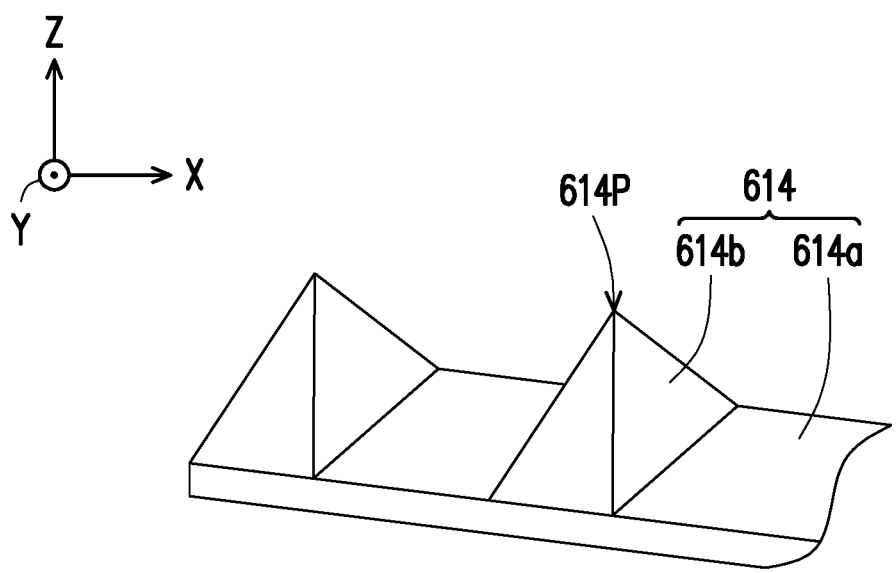

FIGS. 5A to 5B are schematic views of a portion of the stents in accordance others embodiments of the present disclosure.

Although the plurality of comb portions illustrated in FIG. 1 are continuous structures, it should not limit various embodiments of the present disclosure. Herein, the term "continuous structure" indicates that the contact region or contact area between the wafer and one of the comb portions is continuous. For example, as shown in FIG. 3A, the first contact region 118a between the wafer 300 and one of the first comb portions 114a is continuous in the X direction. In some alternative embodiments of the present disclosure, one of the plurality of comb portions may be a non-continuous structure, as shown in FIG. 5A and FIG. 5B. In detail, referring to FIG. 5A, a comb portion 514 includes a main portion 514a and a plurality of island structures 514b disposed over the main portion 514a. The plurality of island structures 514b are separated from each other and disposed alternately along the X direction. In some embodiments of the present disclosure, one of the plurality of island structures 514b may be a cuboid structure. In some alternative embodiments of the present disclosure, the profile of one of the plurality of island structures 514b and the profile of another of the plurality of island structures 514b may be the same or different from each other. At least one portion (e.g., the plane or the top surface 514T in FIG. 5A) of the plurality of island structures 514b is in contact with the wafer 300 (as shown in FIG. 1). Compared with the continuous structure, the contact area between the wafer and the island structures 514b is further decreased. In some embodiments of the present disclosure, the number of the plurality of island structures 514b is not limited thereto.

Referring to FIG. 5B, a comb portion 614 includes a main portion 614a and a plurality of island structures 614b disposed over the main portion 614a. The plurality of island structures 614b are separated from each other and disposed alternately along the X direction. In some embodiments of the present disclosure, one of the plurality of island structures 614b may be a pyramid structure. The pyramid structure has sidewalls that taper from a bottom surface of the pyramid structure to a vertex of the pyramid structure. In some alternative embodiments of the present disclosure, the profile of one of the plurality of island structures 614b and the profile of another of the plurality of island structures 614b may be the same or different from each other. At least one portion (e.g., the point 614P in FIG. 5B) of the plurality of island structures 614b is in contact with the wafer 300 (as shown in FIG. 1). Compared with the continuous structure, the contact area between the wafer and the island structures 614b further decreases. In some embodiments of the present disclosure, the number of the plurality of island structures 614b is not limited thereto.

Referring to FIG. 1, in some embodiments of the present disclosure, a method for holding the wafer 300 is illustrated herein, in which the wafer container 10 of FIG. 1 may hold the wafer 300 with a limited number of defects formed. It is noted that in addition to the following steps described, other steps may also be included in the method.

The wafer 300 is first inserted into the frame 200 carrying the plural stents 100. Often, for preventing the features (such as the metal layer or the passivation layer) formed on the top surface of the wafer 300 from being scratched, the wafer 300 may be disposed on the stents 100 so that the top surface of the wafer 300 where the features are formed faces up, and the bottom surface of the wafer 300 may face down and be in contact with the top of the stents 100. As shown in FIG. 2, the stents 100 are configured to provide at least three supporting points SP1, SP2, and SP3 to support the wafer 300, and the centroid C of a triangle formed by the three supporting points SP1, SP2, and SP3 overlaps with the center 300C of the wafer 300, thereby balancing the wafer 300 to prevent from tipping.

In accordance with some embodiments of the present disclosure, a wafer container includes a frame and at least a pair of the support structures. The frame has opposite sidewalls. The at least a pair of support structures are respectively disposed on the opposite sidewalls of the frame. The at least a pair of support structures include a first support structure and a second support structure. The first support structure has a first connection portion and a plurality of first comb portions connected to the first connection portion, wherein one of the plurality of first comb portions includes a first main portion and a plurality of first island structures disposed over the first main portion, and the plurality of first island structures are separated from each other. The second support structure has a second connection portion and a plurality of second comb portions connected to the second connection portion, wherein one of the plurality of second comb portions includes a second main portion and a plurality of second island structures disposed over the second main portion and the plurality of second island structures are separated from each other.

In accordance with alternative embodiments of the present disclosure, a wafer container includes a frame, a plurality of first support structures, and a plurality of second support structures. The frame has a first sidewall and a second sidewall extending along a YZ plane, wherein the entire first sidewall is parallel with the entire second side wall. The plurality of first support structures are disposed on the first sidewall and arranged along a Z direction. The plurality of second support structures are disposed on the second sidewall and arranged along the Z direction. One of the plurality of first support structures is horizontally aligned with a corresponding second support structure to constitute a wafer holder. The wafer holder includes a plurality of island structures to hold a wafer in a XY plane, and the plurality of island structures are separated to each other along a X direction.

In accordance with yet alternative embodiments of the present disclosure, a method for holding at least one wafer includes: providing a wafer container including a frame having opposite sidewalls and at least a pair of support structures respectively disposed on the sidewalls of the frame, wherein the at least a pair of support structures include a first supporting structure and a second supporting structure opposite to each other, the first support structure has a first connection portion and a plurality of first comb portions connected to the first connection portion, wherein one of the plurality of first comb portions includes a first main portion and a plurality of first island structures disposed over the first main portion, and the plurality of first island structures are separated from each other, the second support structure has a second connection portion and a plurality of second comb portions connected to the second connection portion, wherein one of the plurality of second comb portions includes a second main portion and a plurality of second island structures disposed over the second main portion and the plurality of second island structures are separated from each other; and inserting the wafer into the wafer container, so that the at least a pair of support structures are configured to provide at least three supporting points to support the wafer in a XY plane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer container, comprising:
   a frame having opposite sidewalls; and
   at least a pair of support structures respectively disposed on the opposite sidewalls of the frame, wherein the at least a pair of support structures comprise:
      a first support structure having a first connection portion extending along a Y direction and a plurality of first comb portions connected to the first connection portion, extending along a X direction, and alternately arranged along the Y direction, wherein one of the plurality of first comb portions comprises a first main portion and a plurality of first island structures disposed over the first main portion, and the plurality of first island structures are separated from each other; and
      a second support structure having a second connection portion extending along the Y direction and a plurality of second comb portions connected to the second connection portion, extending along the X direction, and alternately arranged along the Y direction, wherein one of the plurality of second comb portions comprises a second main portion and a plurality of second island structures disposed over the second main portion and the plurality of second island structures are separated from each other,
   wherein the at least a pair of the supporting structures are configured to provide at least three supporting points to support a wafer in a XY plane.

2. The wafer container of claim 1, wherein the frame having a first sidewall and a second sidewall extending along a YZ plane, wherein the entire first sidewall is parallel with the entire second side wall.

3. The wafer container of claim 1, wherein the plurality of first island structures are disposed alternately along the X direction.

4. The wafer container of claim 1, wherein one of the plurality of first island structures comprises a cuboid structure, and the cuboid structure has a flat top surface to contact the wafer.

5. The wafer container of claim 1, wherein the plurality of second island structures are disposed alternately along the X direction.

6. The wafer container of claim 1, wherein the plurality of first comb portions connecting to the same first connection portion and the plurality of second comb portions connecting to the same second connection portion are configured to support a same wafer.

7. The wafer container of claim 1, wherein one of the plurality of first island structures comprises a pyramid structure, and the pyramid structure has sidewalls that taper from a bottom surface of the pyramid structure to a vertex of the pyramid structure, and the sidewalls of the pyramid structure converge at one point to contact the wafer.

8. The wafer container of claim 7, wherein each sidewall of the pyramid structure has a flat surface.

9. A wafer container, comprising:
   a frame having a first sidewall and a second sidewall extending along a YZ plane, wherein the entire first sidewall is parallel with the entire second side wall;
   a plurality of first support structures, disposed on the first sidewall and alternately arranged along a Z direction, wherein each first support structure comprises:
      a first connection portion disposed on the first sidewall and extending along a Y direction; and
      a plurality of first comb portions connected to the first connection portion, extending along a X direction, and alternately arranged along the Y direction; and
   a plurality of second support structures, disposed on the second sidewall and alternately arranged along the Z direction, wherein each second support structure comprises:
      a second connection portion disposed on the second sidewall and extending along the Y direction; and
      a plurality of second comb portions connected to the second connection portion, extending along the X direction, and alternately arranged along the Y direction,
   wherein one of the plurality of first support structures is horizontally aligned with a corresponding second support structure to constitute a wafer holder,
   wherein the wafer holder comprises a plurality of island structures to hold a wafer in a XY plane, and the plurality of island structures are separated to each other along the X direction.

10. The wafer container of claim 9, wherein one of the plurality of first comb portions comprises a first main portion and a plurality of first island structures disposed over the first main portion, and the plurality of first island structures are separated from each other.

11. The wafer container of claim 10, wherein the plurality of first island structures are disposed alternately along the X direction.

12. The wafer container of claim 10, wherein one of the plurality of second comb portions comprises a second main portion and a plurality of second island structures disposed over the second main portion, and the plurality of second island structures are separated from each other.

13. The wafer container of claim 12, wherein the plurality of second island structures are disposed alternately along the X direction.

14. The wafer container of claim 9, wherein the wafer container comprises a front opening unified pod (FOUP), a front opening shipping box (FOSB), a wafer standardized mechanical interface (SMIF) pod, a sorter, or a combination thereof.

15. The wafer container of claim 9, wherein, wherein one of the plurality of island structures comprises a cuboid structure, and the cuboid structure has a flat top surface to contact the wafer.

16. The wafer container of claim 9, wherein one of the plurality of island structures comprises a pyramid structure, and the pyramid structure has sidewalls that taper from a bottom surface of the pyramid structure to a vertex of the pyramid structure, and the sidewalls of the pyramid structure converge at one point to contact the wafer.

17. The wafer container of claim 16, wherein each sidewall of the pyramid structure has a flat surface.

18. A method for holding at least one wafer, comprising:
providing a wafer container comprising a frame having opposite sidewalls and at least a pair of support structures respectively disposed on the sidewalls of the frame, wherein the at least a pair of support structures comprise a first supporting structure and a second supporting structure opposite to each other,
the first support structure has a first connection portion extending along a Y direction and a plurality of first comb portions connected to the first connection portion, extending along a X direction, and alternately arranged along the Y direction, wherein one of the plurality of first comb portions comprises a first main portion and a plurality of first island structures disposed over the first main portion, and the plurality of first island structures are separated from each other,
the second support structure has a second connection portion extending along the Y direction and a plurality of second comb portions connected to the second connection portion, extending along the X direction, and alternately arranged along the Y direction, wherein one of the plurality of second comb portions comprises a second main portion and a plurality of second island structures disposed over the second main portion and the plurality of second island structures are separated from each other; and
inserting the wafer into the wafer container, so that the at least a pair of support structures are configured to provide at least three supporting points to support the wafer in a XY plane.

19. The method of claim 18, wherein the frame having a first sidewall and a second sidewall extending along a YZ plane, wherein the entire first sidewall is parallel with the entire second side wall.

20. The method of claim 18, wherein the plurality of first comb portions connecting to the same first connection portion and the plurality of second comb portions connecting to the same second connection portion are configured to support a same wafer.

* * * * *